United States Patent
Nozawa

(10) Patent No.: US 12,145,382 B2
(45) Date of Patent: Nov. 19, 2024

(54) PRINTING APPARATUS

(71) Applicant: SEIKO EPSON CORPORATION, Tokyo (JP)

(72) Inventor: Dai Nozawa, Nagano (JP)

(73) Assignee: Seiko Epson Corporation, Tokyo (JP)

( * ) Notice: Subject to any disclaimer, the term of this patent is extended or adjusted under 35 U.S.C. 154(b) by 161 days.

(21) Appl. No.: 18/169,904

(22) Filed: Feb. 16, 2023

(65) Prior Publication Data

US 2023/0264500 A1  Aug. 24, 2023

(30) Foreign Application Priority Data

Feb. 18, 2022 (JP) ................. 2022-023582

(51) Int. Cl.
*B41J 29/377* (2006.01)
*H05K 1/02* (2006.01)

(52) U.S. Cl.
CPC .......... *B41J 29/377* (2013.01); *H05K 1/0209* (2013.01)

(58) Field of Classification Search
CPC ..................................................... B41J 29/377
See application file for complete search history.

(56) References Cited

U.S. PATENT DOCUMENTS

2009/0135219 A1* 5/2009 Nathan ............... B41J 2/1408
347/18
2015/0258781 A1* 9/2015 Domae ............... B41J 2/04581
347/10

FOREIGN PATENT DOCUMENTS

JP  H06-112678 A    4/1994
JP  2022125524 A *  8/2022  ........... B41J 19/005

OTHER PUBLICATIONS

Umagoe, Machine Translation of JP-2022125524-A, 2022 (Year: 2022).*

* cited by examiner

*Primary Examiner* — Scott A Richmond
(74) *Attorney, Agent, or Firm* — Global IP Counselors, LLP

(57) ABSTRACT

A printing apparatus includes a liquid ejecting head that ejects a printing liquid to form an image on a medium, a circuit board provided with a drive circuit for driving the liquid ejecting head, and a storage mechanism for storing a cooling liquid in a liquid storage space. The storage mechanism stores the cooling liquid in the liquid storage space in which all of the drive circuit and a circuit arrangement portion of the circuit board are immersed in the cooling liquid. The circuit arrangement portion of the circuit board is provided with the drive circuit.

6 Claims, 9 Drawing Sheets

FIG. 6

| Sd[m] | D[m] | QS[m] ||
|---|---|---|---|
| | | TQ1 | TQ2 |
| 1 | DP-1 | H | H |
| 2 | DP-2 | H | L |
| 3 | DP-3 | L | H |
| 4 | DP-N | L | L |

PRINTING APPARATUS

The present application is based on, and claims priority from JP Application Serial Number 2022-023582, filed Feb. 18, 2022, the disclosure of which is hereby incorporated by reference herein in its entirety.

BACKGROUND

1. Technical Field

The present disclosure relates to a printing apparatus.

2. Related Art

In a printing apparatus that drives a liquid ejecting head, thereby ejecting a printing liquid such as ink from the liquid ejecting head to form an image on a medium, it is possible that a drive circuit for driving the liquid ejecting head may malfunction due to heat generated in the drive circuit. Moreover, it is possible that the drive circuit may malfunction when dust adheres to the drive circuit. To suppress such malfunction of the drive circuit, JP-A-6-112678 proposes a technique related to a printing apparatus provided with a housing that cools the drive circuit and suppresses the dust adhering to the drive circuit.

However, according to the technique described in JP-A-6-112678, when the printing liquid ejected from the liquid ejecting head becomes a mist and floats inside the printing apparatus, adherence of the mist to the drive circuit cannot be suppressed. For this reason, the drive circuit may malfunction due to adherence of the mist generated following the ejection of the printing liquid to the drive circuit.

SUMMARY

A printing apparatus according to the present disclosure includes: a liquid ejecting head that ejects a printing liquid to form an image on a medium; a circuit board provided with a drive circuit for driving the liquid ejecting head; and a storage mechanism for storing a cooling liquid in a liquid storage space. The storage mechanism stores the cooling liquid in the liquid storage space in which all of the drive circuit and a circuit arrangement portion of the circuit board are immersed in the cooling liquid, the circuit arrangement portion being provided with the drive circuit.

BRIEF DESCRIPTION OF THE DRAWINGS

FIG. 6 is an explanatory diagram for explaining an example of an individual designation signal.

DESCRIPTION OF EXEMPLARY EMBODIMENTS

Hereinafter, embodiments for carrying out the present disclosure will be described with reference to the drawings. It should be noted that, in the respective drawings, dimensions and scales of the respective portions are appropriately differentiated from actual ones. Moreover, the embodiments described below are suitable specific examples of the present disclosure, and accordingly, a variety of technically preferable limitations are imposed thereon. However, the scope of the present disclosure is not limited to these embodiments unless otherwise described to limit the present disclosure in the following description.

A. Embodiment

In this embodiment, a printing apparatus will be described by illustrating an ink jet printer that ejects ink onto recording paper PP to form an image thereon.

1. Overview of Ink Jet Printer

Hereinafter, an example of a configuration of an ink jet printer 1 according to this embodiment will be described with reference to FIGS. 1 to 3.

Figure 1:
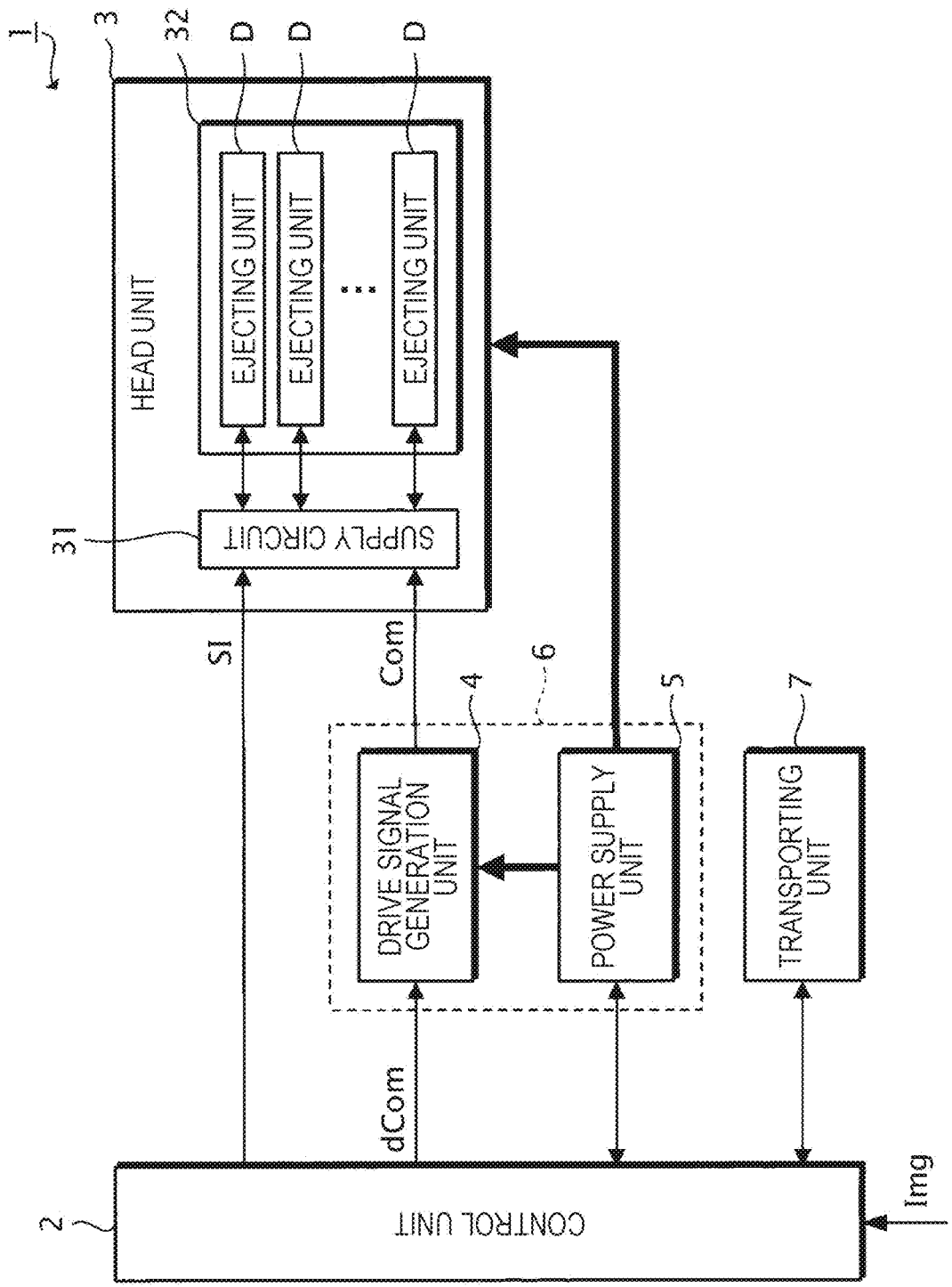
FIG. 1 is a block diagram illustrating an example of a configuration of an ink jet printer according to an embodiment of the present disclosure.

FIG. 1 is a functional block diagram illustrating the example of the configuration of the ink jet printer 1.

As illustrated in FIG. 1, the ink jet printer 1 is supplied with print data Img, which indicates an image to be formed by the ink jet printer 1, from a host computer such as a personal computer or a digital camera. The ink jet printer 1 executes a printing process for forming, on the recording paper PP, the image indicated by the print data Img supplied from the host computer.

The ink jet printer 1 includes: a control unit 2 that controls respective portions of the ink jet printer 1; a head unit 3 provided with ejecting portions D which eject ink; a drive signal generation unit 4 that generates drive signals Com for driving the ejecting portions D; a power supply unit 5 that supplies electric power to the head unit 3 and the drive signal generation unit 4; and a transporting unit 7 for changing a relative position of the recording paper PP with respect to the head unit 3.

Note that the ink is an example of a printing liquid and that the recording paper PP is an example of a medium. Moreover, the ink jet printer 1 that ejects the ink is an example of a printing apparatus, the head unit 3 provided with the ejecting portions D which eject the ink is an example of a liquid ejecting head, and the drive signal generation unit 4 that generates the drive signals Com for driving the head unit 3 is configured, for example, by including one or a plurality of electrical circuits and is an example of a drive signal generation circuit. The power supply unit 5 that supplies electric power to the head unit 3 and the drive signal generation unit 4 is configured, for example, by including one or a plurality of electrical circuits and is an example of a power supply circuit. Further, hereinafter, the drive signal generation unit 4 and the power supply unit 5 will sometimes be referred to as a drive unit 6. The drive unit 6 is configured by including one or a plurality of electrical circuits and is an example of a drive circuit.

In this embodiment, it is assumed that the ink jet printer 1 includes one or a plurality of head units 3 and one or a plurality of drive signal generation units 4 having a one-to-one correspondence to the one or the plurality of head units 3. Specifically, in this embodiment, it is assumed that the ink jet printer 1 includes four head units 3 and four drive signal generation units 4 having a one-to-one correspondence to the four head units 3. However, hereinafter, for convenience of explanation, a description will sometimes be given while focusing on one head unit 3 of the four head units 3 and one drive signal generation unit 4 of the four drive signal generation units 4, which is provided so as to correspond to the one head unit 3, as illustrated in FIG. 1.

The control unit 2 is configured by including one or a plurality of CPUs. However, the control unit 2 may include programmable logic devices such as FPGAs in place of or in addition to the CPUs. Herein, "CPU" is an abbreviation for central processing unit, and "FPGA" is an abbreviation for field programmable gate array. Moreover, the control unit 2 includes a memory. The memory is configured by including one or both of a volatile memory and a nonvolatile memory. Examples of the volatile memory includes a random access memory (RAM). Examples of the nonvolatile memory includes a read-only memory (ROM), an electrically erasable programmable read-only memory (EEPROM), and a programmable ROM (PROM).

Although details will be described later, the control unit 2 generates signals such as print signals SI and waveform designation signals dCom, the signals serving to control operations of the respective portions of the ink jet printer 1.

Herein, the waveform designation signals dCom are digital signals which define waveforms of the drive signals Com. The drive signals Com are analog signals for driving the ejecting portions D. The drive signal generation unit 4 includes a DA conversion circuit and generates the drive signals Com having the waveforms defined by the waveform designation signals dCom. The print signals SI are digital signals which designate types of operations of the ejecting portions D. Specifically, the print signals SI are signals which designate the types of the operations of the ejecting portions D by designating whether or not to supply the drive signals Com to the ejecting portions D.

As illustrated in FIG. 1, the head unit 3 includes a supply circuit 31 and a recording head 32.

The recording head 32 includes M ejecting portions D. Herein, the value M is a natural number that satisfies M≥1. Note that, hereinafter, an m-th ejecting portion D of the M ejecting portions D provided in the recording head 32 will sometimes be referred to as an ejecting portion D[m]. Herein, the variable m is a natural number that satisfies 1≤m≤M. Moreover, hereinafter, when the component, the signal, or the like in the ink jet printer 1 corresponds to the ejecting portion D[m] of the M ejecting portions D, a reference symbol or numeral for denoting the component, the signal, or the like will sometimes be appended with a subscript [m].

In accordance with the print signal SI, the supply circuit 31 determines whether or not to supply the drive signal Com to the ejecting portion D[m]. Note that, hereinafter, of the drive signals Com, the drive signal Com to be supplied to the ejecting portion D[m] will sometimes be referred to as a supplied drive signal Vin[m].

As mentioned above, in this embodiment, the ink jet printer 1 executes the printing process. When the printing process is executed, the control unit 2 generates, in accordance with the print data Img, signals, such as the print signal SI, for controlling the head unit 3. Moreover, when the printing process is executed, the control unit 2 generates signals, such as the waveform designation signal dCom, for controlling the drive signal generation unit 4. Further, when the printing process is executed, the control unit 2 generates the signal for controlling the transporting unit 7. Thus, in the printing process, while controlling the transporting unit 7 to change the relative position of the recording paper PP with respect to the head unit 3, the control unit 2 determines, for example, whether or not to eject the ink from the ejecting portion D[m], an ejection amount of the ink, and ejection timing of the ink, and controls the respective portions of the ink jet printer 1 so that an image corresponding to the print data Img is formed on the recording paper PP.

Figure 2:
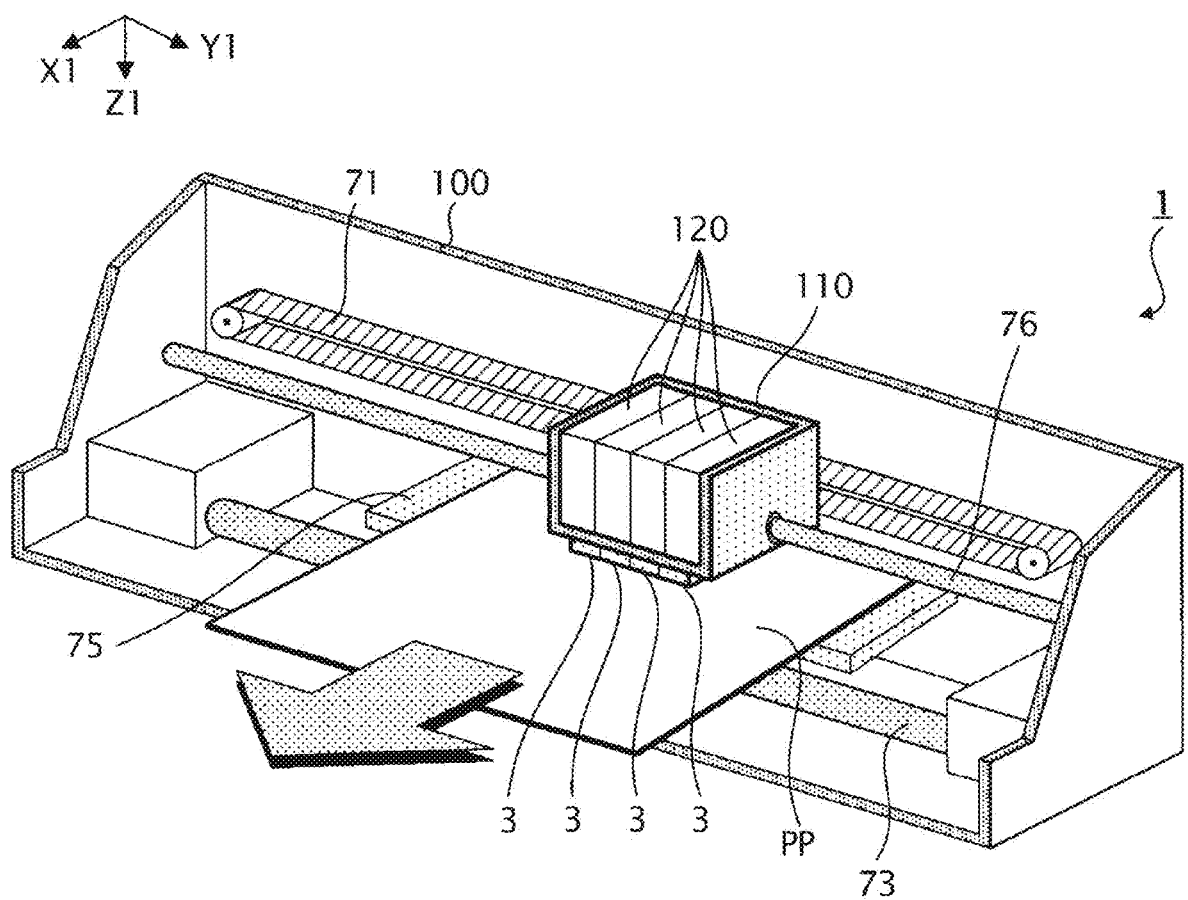
FIG. 2 is a schematic perspective view illustrating an example of an internal structure of the ink jet printer.

FIG. 2 is a schematic perspective view illustrating an example of an internal structure of the ink jet printer 1.

As illustrated in FIG. 2, in this embodiment, it is assumed that the ink jet printer 1 is a serial printer. Specifically, when executing the printing process, the ink jet printer 1 reciprocally moves the head unit 3, while transporting the recording paper PP in an X1-direction, in a Y1-direction that intersects the X1-direction and in a Y2-direction opposite from the Y1-direction and causes the ejecting portion D[m] to eject the ink, thereby forming, on the recording paper PP, dots Dt corresponding to the print data Img.

Hereinafter, the X1-direction and the X2-direction opposite from the X1-direction will be collectively referred to as "X-axis direction", the Y1-direction that intersects the X-axis direction and a Y2-direction opposite from the Y1-direction will be collectively referred to as "Y-axis direction", and a Z1-direction that intersects the X-axis direction and the Y-axis direction and a Z2-direction opposite from the Z1-direction will be collectively referred to as "Z-axis direction". This embodiment will be described by assuming, as an example, that the X-axis direction, the Y-axis direction, and the Z-axis direction are perpendicular to one another. However, the present disclosure is not limited to such a mode; the X-axis direction, the Y-axis direction, and the Z-axis direction need only intersect one another. Note that, in this embodiment, it is assumed that the Z1-direction is a direction in which the ink is ejected from the ejecting portion D[m].

As illustrated in FIG. 2, the ink jet printer 1 according to this embodiment includes a housing 100, and a carriage 110 that is reciprocally movable in the Y-axis direction in the housing 100 and on which the four head units 3 are mounted.

In this embodiment, as illustrated in FIG. 2, it is assumed that the carriage 110 houses four ink cartridges 120 having a one-to-one correspondence to four colors of ink, which are cyan, magenta, yellow, and black. Moreover, in this embodiment, as mentioned above, it is assumed that the ink jet printer 1 includes the four head units 3 having a one-to-one correspondence to the four ink cartridges 120. Each ejecting portion D[m] receives supply of the ink from the ink cartridge 120 corresponding to the head unit 3 provided with the ejecting portion D[m]. Thus, each ejecting portion D[m] can load the supplied ink into an inside thereof and can eject the loaded ink from a nozzle N. Note that the ink cartridge 120 may be provided outside the carriage 110.

Moreover, as mentioned above, the ink jet printer 1 according to this embodiment includes the transporting unit 7. As illustrated in FIG. 2, the transporting unit 7 includes a carriage transporting mechanism 71 for reciprocally moving the carriage 110 in the Y-axis direction, a carriage guide shaft 76 that reciprocally movably supports the carriage 110 in the Y-axis direction, a medium transporting mechanism 73 for transporting the recording paper PP, and a platen 75 provided in the Z1-direction of the carriage 110. Therefore, when the printing process is executed, the transporting unit 7 reciprocally moves the head units 3 in the Y-axis direction along the carriage guide shaft 76 together with the carriage 110 by using the carriage transporting mechanism 71 and transports the recording paper PP on the platen 75 in the X1-direction by using the medium transporting mechanism 73, thereby enabling the position of the recording paper PP to be changed with respect to the head units 3 and enabling the ink to land on the whole of the recording paper PP.

Figure 3:
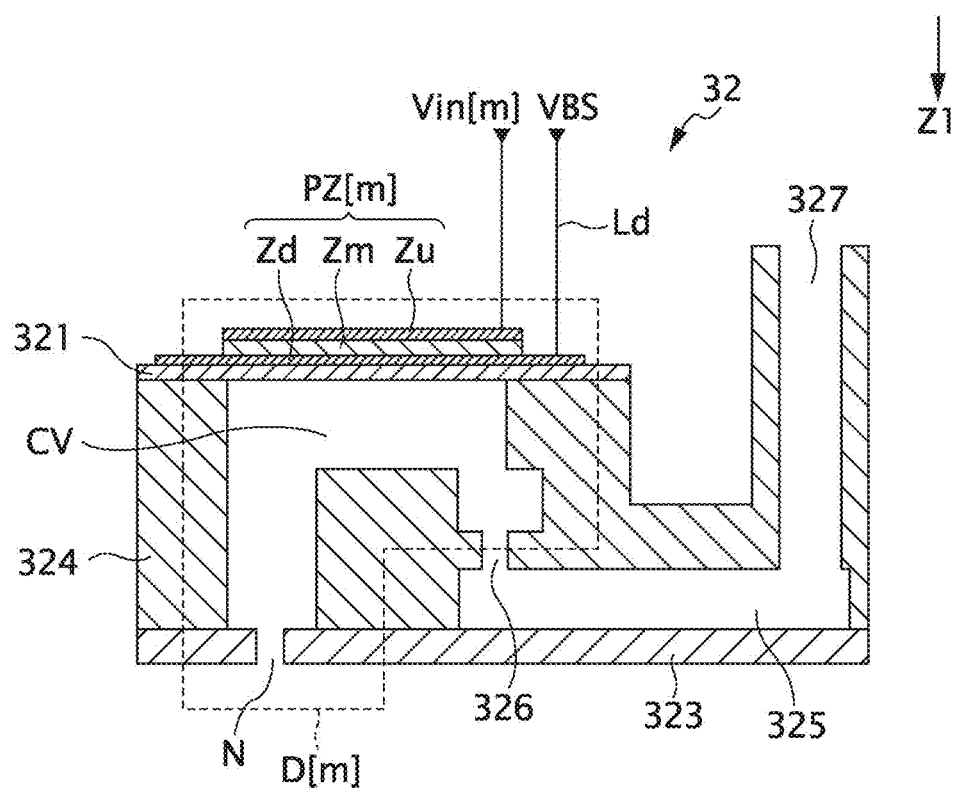
FIG. 3 is a sectional view for explaining an example of a structure of an ejecting portion.

FIG. 3 is a schematic partial sectional view of the recording head 32 illustrating a section including the ejecting portion D[m].

As illustrated in FIG. 3, the ejecting portion D[m] includes a piezoelectric element PZ[m], a cavity CV inside which the ink is loaded, a nozzle N that communicates with the cavity CV, and a vibrating plate 321. The ejecting portion D[m] ejects the ink in the cavity CV from the nozzle N by driving the piezoelectric element PZ[m] with the supplied drive signal Vin[m]. The cavity CV is a space partitioned by a cavity plate 324, a nozzle plate 323 in which the nozzle N is formed, and the vibrating plate 321. The cavity CV communicates with a reservoir 325 via an ink supply port 326. The reservoir 325 communicates via an ink inlet 327 with the ink cartridge 120 corresponding to the ejecting portion D[m]. The piezoelectric element PZ[m] has an upper electrode Zu[m], a lower electrode Zd[m], and a piezoelectric body Zm[m] provided between the upper electrode Zu[m] and the lower electrode Zd[m]. The lower electrode Zd[m] is electrically coupled to a power supply line LD set to a potential VBS. When the supplied drive signal Vin[m] is supplied to the upper electrode Zu[m] and a voltage is applied between the upper electrode Zu[m] and the lower electrode Zd[m], the piezoelectric element PZ[m] is displaced in the Z1-direction or the Z2-direction according to the voltage thus applied, and as a result, the piezoelectric element PZ[m] vibrates. The lower electrode Zd[m] is joined to the vibrating plate 321. Therefore, when the piezoelectric element PZ[m] vibrates by being driven by the supplied drive signal Vin[m], the vibrating plate 321 also vibrates. Then, a volume of the cavity CV and a pressure in the cavity CV change in response to the vibration of the vibrating plate 321, and the ink loaded into the cavity CV is ejected from the nozzle N.

Note that, a portion of the ink ejected from the nozzle N in the printing process becomes a mist before landing on the recording paper PP and floats inside the housing 100.

2. Overview of Head Unit

Hereinafter, an overview of the head unit 3 will be described with reference to FIGS. 4 to 6.

Figure 4:
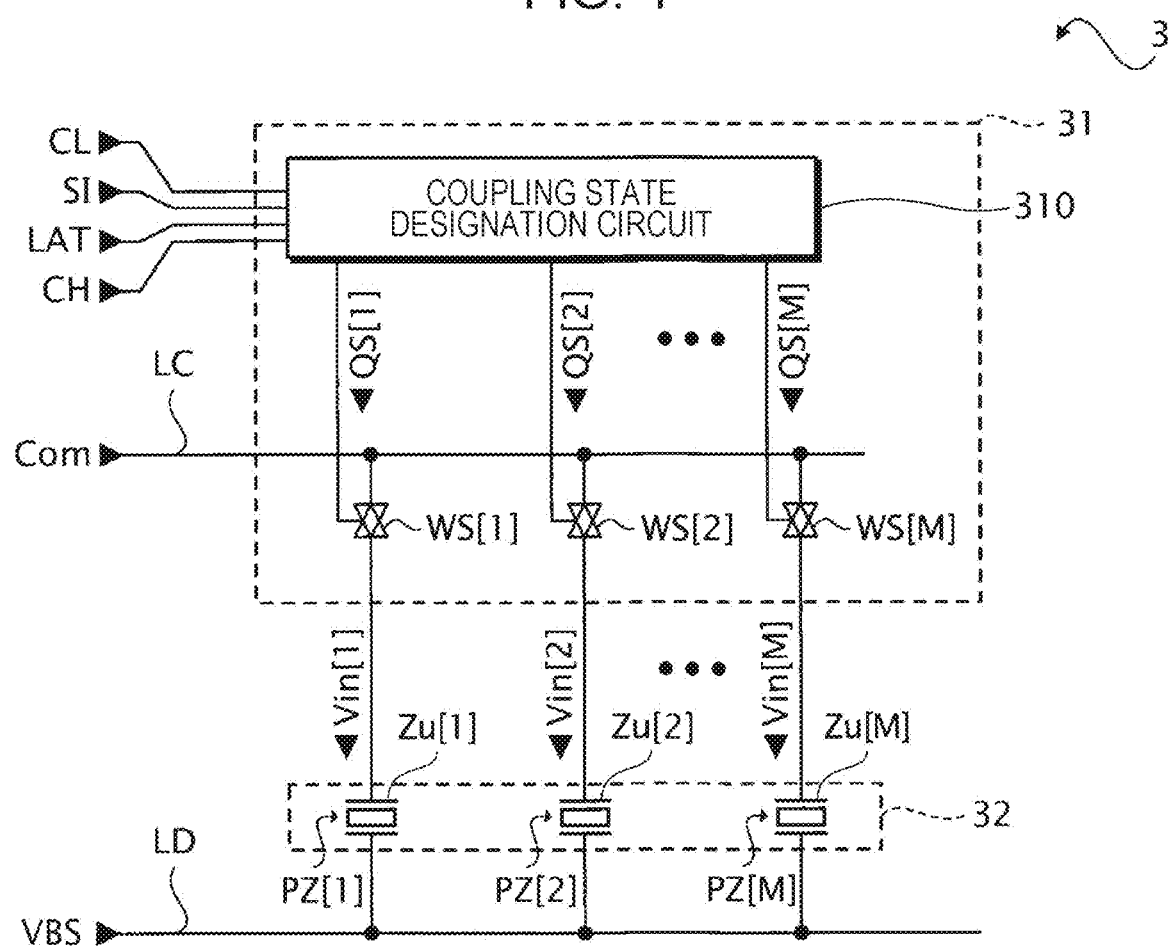
FIG. 4 is a block diagram illustrating an example of a configuration of a head unit.

FIG. 4 is a block diagram illustrating an example of a configuration of the head unit 3.

As illustrated in FIG. 4, the head unit 3 includes the supply circuit 31 and the recording head 32. Moreover, the head unit 3 includes a wiring line LC for supplying the drive signal Com from the drive signal generation unit 4.

As illustrated in FIG. 4, the supply circuit 31 includes M switches WS[1] to WS[M] corresponding respectively to the M ejecting portions D[1] to D[M], and a coupling state designation circuit 310 that designates coupling states of the respective switches.

In accordance with at least some signals of the print signal SI, a latch signal LAT, and a change signal CH, which are supplied from the control unit 2, the coupling state designation circuit 310 generates a coupling state designation signal QS[m] that designates on/off of the switch WS[m].

In accordance with the coupling state designation signal QS[m], the switch WS[m] switches between conduction and non-conduction between the wiring line LC and the upper electrode Zu[m] of the piezoelectric element PZ[m] provided in the ejecting portion D[m]. In this embodiment, the switch WS[m] turns on when the coupling state designation signal QS[m] is at a high level and turns off when the coupling state designation signal QS[m] is at a low level. When the switch WS[m] turns on, the drive signal Com supplied to the wiring line LC is supplied as the supplied drive signal Vin[m] to the upper electrode Zu[m] of the ejecting portion D[m].

In this embodiment, when the ink jet printer 1 executes the printing process, one or a plurality of unit periods TP are set as operation periods of the ink jet printer 1. In each of the unit periods TP, the ink jet printer 1 according to this embodiment can drive each ejecting portion D[m] for the printing process.

Figure 5:
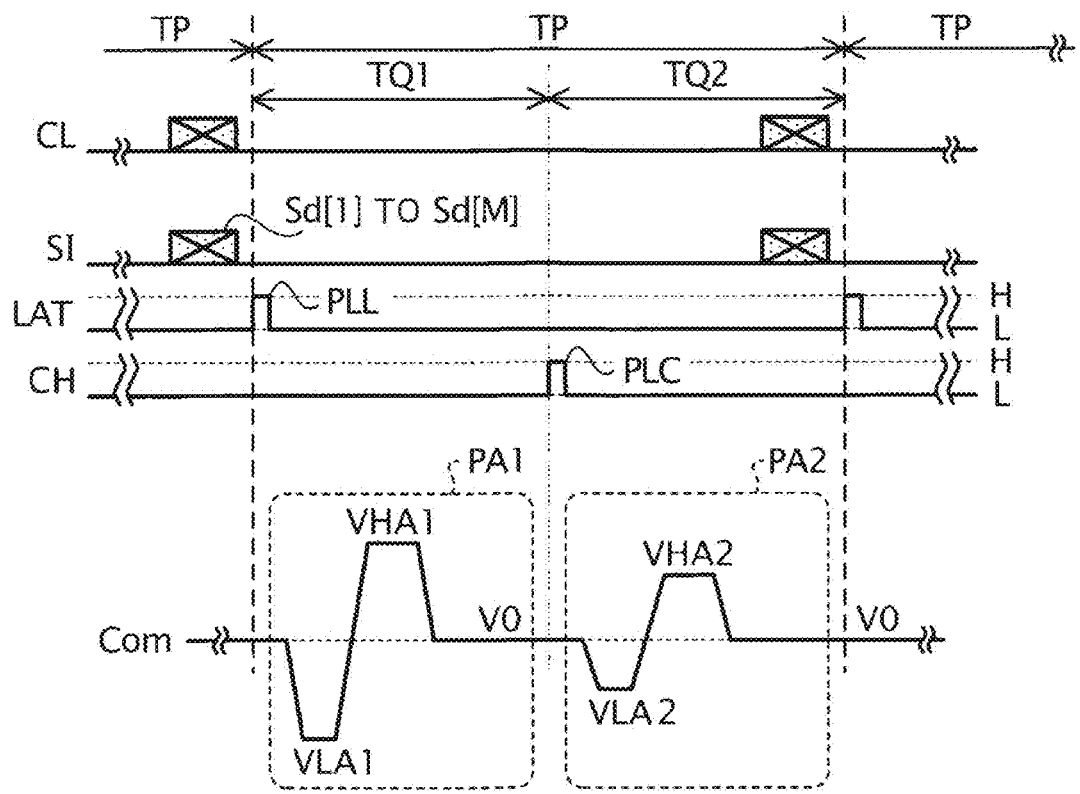
FIG. 5 is a timing chart for explaining an example of signals supplied to the head unit.

FIG. 5 is a timing chart illustrating a variety of signals, such as the drive signal Com, supplied to the head unit 3 in the unit period TP.

As illustrated in FIG. 5, the control unit 2 outputs the latch signal LAT having pulses PLL. Thus, the control unit 2 defines the unit period TP as a period from a rise of the pulse PLL to a rise of the next pulse PLL.

Moreover, in the unit period TP, the control unit 2 outputs the change signal CH having the pulses PLC. Then, the control unit 2 divides the unit period TP into a drive period TQ1 from the rise of the pulse PLL to a rise of the pulse PLC and a drive period TQ2 from the rise of the pulse PLC to a rise of the pulse PLL.

As illustrated in FIG. 5, the print signal SI includes M individual designation signals Sd[1] to Sd[M] corresponding respectively to the M ejecting portions D[1] to D[M]. When the ink jet printer 1 executes the printing process, the individual designation signal Sd[m] designates a drive mode of the ejecting portion D[m] in each unit period TP. Prior to each unit period TP, the control unit 2 supplies the print signal SI, which includes the M individual designation signals Sd[1] to Sd[m], to the coupling state designation circuit 310 in synchronization with a clock signal CL. Then, in the unit period TP, the coupling state designation circuit 310 generates the coupling state designation signal QS[m] in accordance with the individual designation signal Sd[m].

Note that, in this embodiment, it is assumed that, in the unit period TP in which the printing process is executed, the ejecting portion D[m] is capable of forming any dot Dt of a large dot composed of ink with an amount of ink $\xi 1$, a middle dot composed of ink with an amount of ink $\xi 2$ smaller than the amount of ink $\xi 1$, and a small dot composed of ink with an amount $\xi 3$ of ink smaller than the amount of ink $\xi 2$.

FIG. 6 is an explanatory diagram for explaining the individual designation signal Sd[m].

As illustrated in FIG. 6, in this embodiment, in the unit period TP in which the printing process is executed, the individual designation signal Sd[m] can adopt any one value of four values which are: a value "1" that designates the ejecting portion D[m] as a large-dot-forming ejecting portion DP-1; a value "2" that designates the ejecting portion D[m] as a middle-dot-forming ejecting portion DP-2; a value "3" that designates the ejecting portion D[m] as a small-dot-forming ejecting portion DP-3; and a value "4" that designates the ejecting portion D[m] as a non-dot-forming ejecting portion DP-N. Herein, the large-dot-forming ejecting portion DP-1 is an ejecting portion D that forms a large dot in the unit period TP; the middle-dot-forming ejecting portion DP-2 is an ejecting portion D that forms a middle dot in the unit period TP; and the small-dot-forming ejecting portion DP-3 is an ejecting portion D that forms a small dot in the unit period TP. Moreover, the non-dot-forming ejecting portion DP-N is an ejecting portion D that does not form any dot in the unit period TP.

The description is returned to FIG. 5.

As illustrated in FIG. 5, in this embodiment, the drive signal Com has a waveform PA1 provided in the drive period TQ1 and a waveform PA2 provided in the drive period TQ2.

Of these, the waveform PA1 is a waveform that starts at a reference potential V0, passes through a potential VLA1 lower than the reference potential V0 and a potential VHA1 higher than the reference potential V0, and returns to the reference potential V0. The waveform PA1 is determined so that, when the supplied drive signal Vin[m] having the waveform PA1 is supplied to the ejecting portion D[m], ink equivalent to an amount of ink φ1 is ejected from the ejecting portion D[m].

Moreover, the waveform PA2 is a waveform that starts at the reference potential V0, passes through a potential VLA2 lower than the reference potential V0 and a potential VHA2 higher than the reference potential V0, and returns to the reference potential V0. The waveform PA2 is determined so that, when the supplied drive signal Vin[m] having the waveform PA2 is supplied to the ejecting portion D[m], ink equivalent to an amount of ink φ2 is ejected from the ejecting portion D[m].

Note that, in this embodiment, it is assumed that the amount of ink ξ1 is equivalent to a total amount of the amount of ink φ1 and the amount of ink φ2, the amount of ink ξ2 is equivalent to the amount of ink φ1, and the amount of ink ξ3 is equivalent to the amount of ink φ2.

Moreover, in this embodiment, as an example, it is assumed that, when the potential of the supplied drive signal Vin[m] supplied to the ejecting portion D[m] is high, the volume of the cavity CV provided in the ejecting portion D[m] is reduced compared with when the potential is low. Therefore, when the ejecting portion D[m] is driven by the supplied drive signal Vin[m] having the waveform PA1 and the like, the potential of the supplied drive signal Vin[m] changes from such a low potential to such a high potential, such that the ink in the ejecting portion D[m] is ejected from the nozzle N.

As illustrated in FIG. 6, when the individual designation signal Sd[m] indicates the value "1" that designates the ejecting portion D[m] as the large-dot-forming ejecting portion DP-1 in the unit period TP, the coupling state designation circuit 310 sets the coupling state designation signal QS[m] to the high level in the drive period TQ1 and the drive period TQ2. In this case, the switch WS[m] turns on in the drive period TQ1 and the drive period TQ2. Therefore, in the unit period TP, the ejecting portion D[m] is driven by the supplied drive signal Vin[m] having the waveform PA1 and the waveform PA2 and ejects the ink with the amount of ink ξ1 equivalent to a large dot.

Moreover, when the individual designation signal Sd[m] indicates the value "2" that designates the ejecting portion D[m] as the middle-dot-forming ejecting portion DP-2 in the unit period TP, the coupling state designation circuit 310 sets the coupling state designation signal QS[m] to the high level in the drive period TQ1, and in this case, the switch WS[m] turns on in the drive period TQ1. Therefore, in the unit period TP, the ejecting portion D[m] is driven by the supplied drive signal Vin[m] having the waveform PA1 and ejects the ink with the amount of ink 2 equivalent to a middle dot.

Moreover, when the individual designation signal Sd[m] indicates the value "3" that designates the ejecting portion D[m] as the small-dot-forming ejecting portion DP-3 in the unit period TP, the coupling state designation circuit 310 sets the coupling state designation signal QS[m] to the high level in the drive period TQ2. In this case, the switch WS[m] turns on in the drive period TQ2. Therefore, in the unit period TP, the ejecting portion D[m] is driven by the supplied drive signal Vin[m] having the waveform PA2 and ejects the ink with the amount of ink 3 equivalent to a small dot.

Moreover, when the individual designation signal Sd[m] indicates the value "4" that designates the ejecting portion D[m] as the non-dot-forming ejecting portion DP-N in the unit period TP, the coupling state designation circuit 310 sets the coupling state designation signal QS[m] to the low level during the unit period TP. In this case, the switch WS[m] turns off during the unit period TP. Therefore, in the unit period TP, the ejecting portion D[m] is not driven by the supplied drive signal Vin[m] and does not eject any ink.

3. Drive Signal Generation Unit

Hereinafter, an overview of the drive signal generation unit 4 will be described with reference to FIG. 7.

Figure 7:
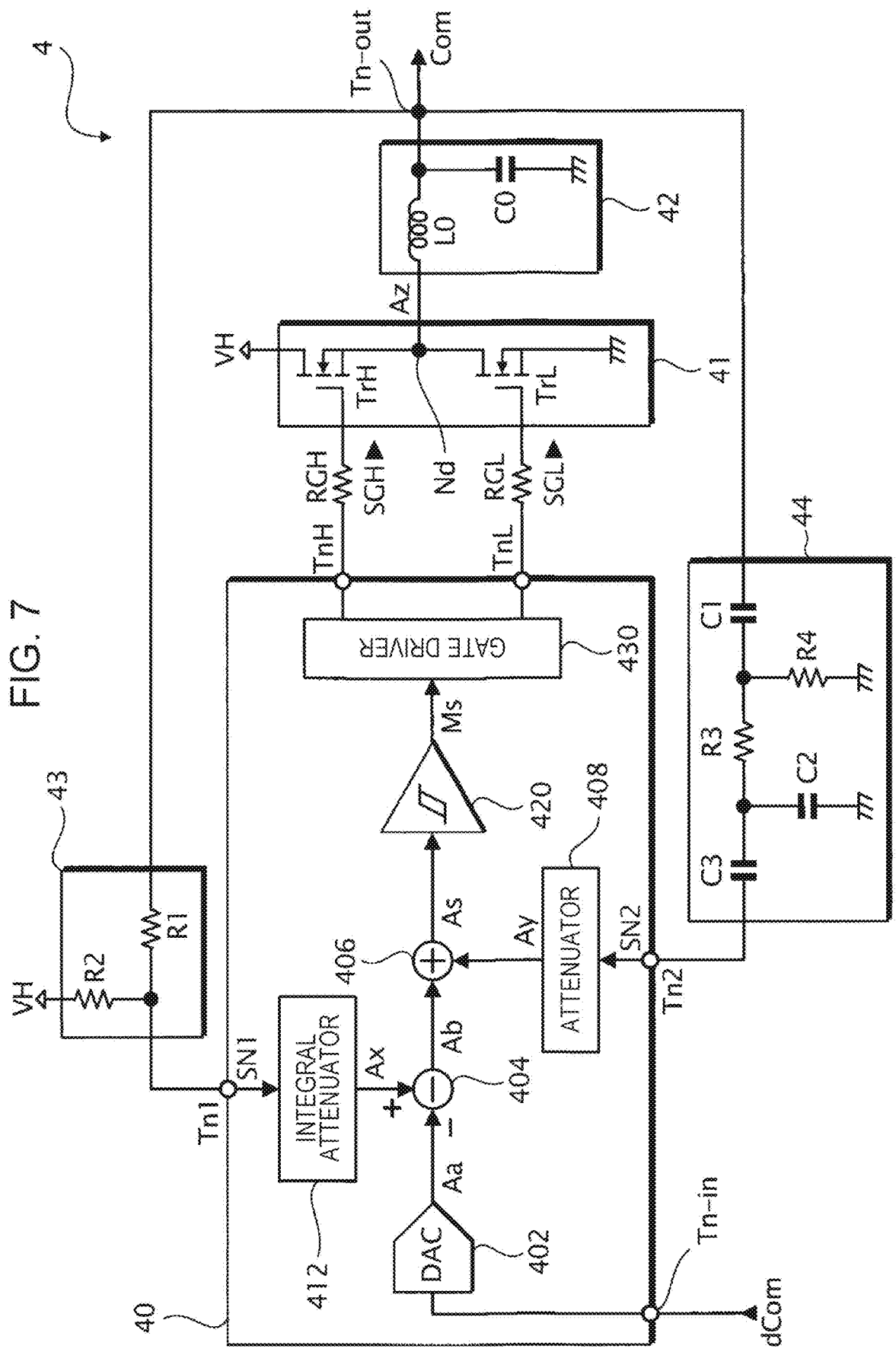
FIG. 7 is a block diagram illustrating an example of a configuration of a drive signal generation unit.

FIG. 7 is a block diagram illustrating an example of a circuit configuration of the drive signal generation unit 4.

As illustrated in FIG. 7, the drive signal generation unit 4 includes an integrated circuit 40, an amplifier circuit 41, a smoothing circuit 42, a pull-up circuit 43, and a filter circuit 44 and generates the drive signal Com in accordance with the waveform designation signal dCom.

The integrated circuit 40 is, for example, an LSI, that is, a large scale integration, and generates a gate signal SGH and a gate signal SGL in accordance with the waveform designation signal dCom. The integrated circuit 40 includes an analog conversion circuit 402, a subtractor 404, an adder 406, an attenuator 408, an integral attenuator 412, a comparator 420, and a gate driver 430.

The analog conversion circuit 402 is a DAC, that is, a digital-to-analog converter, and converts the waveform designation signal dCom that is a digital signal into a signal Aa that is an analog signal. Note that a voltage amplitude of the signal Aa is, for example, approximately 0 to 2 volts, and a signal obtained by amplifying this voltage by approximately 20 times becomes the drive signal Com. That is, the signal Aa is a signal before the drive signal Com is amplified.

The integral attenuator 412 outputs a signal Ax obtained by attenuating and then integrating a signal SN1 input to a terminal Tn1 to be described later.

The subtractor 404 outputs a signal Ab indicating a potential obtained by subtracting a potential of the signal Aa from a potential of the signal Ax.

The attenuator 408 outputs a signal Ay obtained by attenuating a high-frequency component of a signal SN2 input to a terminal Tn2 to be described later.

The adder 406 outputs a signal As indicating a potential obtained by adding the potential of the signal Ab and a potential of the signal Ay to each other.

The comparator 420 outputs a modulated signal Ms obtained by pulse-modulating the signal As. Specifically, the comparator 420 outputs such a modulated signal Ms that switches to the H level when a voltage of the signal As becomes equal to or higher than a threshold voltage Vth1 when the voltage rises, and switches to the L level when the voltage of the signal As falls below a threshold voltage Vth2 when the voltage drops. Note that the threshold voltage Vth1 and the threshold voltage Vth2 are set to a relationship of Vth1>Vth2.

Note that a power supply voltage of a circuit from the analog conversion circuit 402 to the comparator 420 is, for example, a low voltage such as 3.3 volts. In contrast, the drive signal Com has a large amplitude, and for example, a voltage thereof sometimes exceeds 40 volts. Therefore, in the integral attenuator 412, the signal SN1 having an amplitude corresponding to the drive signal Com is attenuated, and an amplitude range of the signal Ax is matched to an amplitude range of the signal in a circuit ranging from the analog conversion circuit 402 to the comparator 420.

Although this embodiment is described by illustrating the digital signal as the waveform designation signal dCom, the waveform designation signal dCom need only be a signal that defines a target value for generating the drive signal Com, and for example, the analog signal Aa may be used as the waveform designation signal dCom. When the signal Aa is the waveform designation signal dCom, the integrated circuit 40 may be configured without including the analog conversion circuit 402.

The gate driver 430 outputs, to a terminal TnH, the gate signal SGH obtained by converting the modulated signal Ms into a specific amplitude. Moreover, the gate driver 430 outputs, to a terminal TnL, the gate signal SGL obtained by converting a signal into a specific amplitude, the signal being obtained by inverting a logic level of the modulated signal Ms.

The amplifier circuit 41 includes, for example, a transistor TrH and a transistor TrL, and in accordance with the gate signal SGH and the gate signal SGL, which are output from the integrated circuit 40, generates an amplified signal Az that is a signal obtained by amplifying the modulated signal Ms. Note that, in this embodiment, as an example, it is assumed that the transistor TrH and the transistor TrL are N-channel field effect transistors, that is, N-channel FETs.

The gate signal SGH output from the gate driver 430 is input to a gate electrode of the transistor TrH via the terminal TnH and a resistor RGH. Moreover, the gate signal SGL output from the gate driver 430 is input to a gate electrode of the transistor TrL via the terminal TnL and a resistor RGL. Logic levels of the gate signal SGH and the gate signal SGL are in a mutually exclusive relationship. Herein, "mutually exclusive relationship" means that a signal level of the gate signal SGH supplied to the gate electrode of the transistor TrH and a signal level of the gate signal SGL supplied to the gate electrode of the transistor TrL do not attain the high level simultaneously, in other words, that the transistor TrH and the transistor TrL do not turn on simultaneously. Note that the transistor TrH turns on when the gate electrode of the TrH is at the high level and turns off when the gate electrode of the transistor TrH is at the low level. Moreover, the transistor TrL turns on when the gate electrode of the TrL is at the high level and turns off when the gate electrode of the transistor TrL is at the low level.

A drain electrode of the transistor TrH is electrically coupled to a power supply line set to a power supply potential VH on a high potential side, and a source electrode of the transistor TrH is electrically coupled to a node Nd.

Moreover, a source electrode of the transistor TrL is grounded, and a drain electrode of the transistor TrL is electrically coupled to the node Nd. Note that the source electrode of the transistor TrL may be electrically coupled to the power supply line LD set to the potential VBS that is a power supply potential on a low potential side.

As mentioned above, the transistor TrH turns on when the gate signal SGH supplied to the gate electrode of the transistor TrH is at the high level and turns off when the gate signal SGH is at the low level. Moreover, the transistor TrL turns on when the gate signal SGL supplied to the gate electrode of the transistor TrL is at the high level, and turns off when the gate signal SGL is at the low level. Therefore, the amplified signal Az obtained by amplifying the modulated signal Ms will be output to the node Nd that electrically couples the source electrode of the transistor TrH and the drain electrode of the transistor TrL to each other.

The smoothing circuit 42 is an LPF, that is, a low pass filter, and smoothes the amplified signal Az to generate the drive signal Com. The smoothing circuit 42 includes an inductor L0 and a capacitor C0. The inductor L0 has one end electrically coupled to the node Nd and the other end electrically coupled to an output terminal Tn-out. The capacitor C0 has one end electrically coupled to the output terminal Tn-out and the other end grounded.

The pull-up circuit 43 feeds back, to the terminal Tn1, the signal SN1 obtained by pulling up the drive signal Com output to the output terminal Tn-out. The pull-up circuit 43 includes: a resistor R1 that has one end electrically coupled to the output terminal Tn-out and the other end electrically coupled to the terminal Tn1; and a resistor R2 that has one end electrically coupled to the terminal Tn1 and the other end electrically coupled to the power supply line set to the power supply potential VH.

The filter circuit 44 is a BPF, that is, a band pass filter, and feeds back, to the terminal Tn2, the signal SN2 obtained by removing a direct current component of a frequency component in a predetermined band from the drive signal Com. The filter circuit 44 includes: a resistor R3; a capacitor C1 that has one end electrically coupled to the output terminal Tn-out and the other end electrically coupled to one end of the resistor R3; a resistor R4 that has one end electrically coupled to the one end of the resistor R3 and the other end grounded; a capacitor C2 that has one end electrically coupled to the other end of the resistor R3 and the other end grounded; and a capacitor C3 that has one end electrically coupled to the other end of the resistor R3 and the other end electrically coupled to the terminal Tn2. Of these, the capacitor C1 and the resistor R4 function as an HPF, that is, a high pass filter that allows a high-frequency component of a cut-off frequency or higher of the drive signal Com to pass through. Moreover, the resistor R3 and the capacitor C2 function as an LPF, that is, a low pass filter that allows a low-frequency component of the cut-off frequency or lower of the drive signal Com to pass through. In this embodiment, in the filter circuit 44, the cut-off frequency of the HPF is set lower than the cut-off frequency of the LPF. Therefore, the filter circuit 44 allows a frequency component in a predetermined band equal to or higher than the cut-off frequency of the HPF and equal to or lower than the cut-off frequency of the LPF of the drive signal Com to pass through. Moreover, the filter circuit 44 includes the capacitor C3, and accordingly, the filter circuit 44 feeds back, to the terminal Tn2, the signal obtained by removing the direct current component of a signal of the frequency component in the predetermined band, which passes through the HPF and the LPF, from the drive signal Com.

As described above, by using the smoothing circuit 42, the drive signal generation unit 4 smoothes the amplified signal Az at the node Nd, thereby generating the drive signal Com. The drive signal Com is integrated and subtracted by the integral attenuator 412 and is then fed back to the subtractor 404. Hence, self-oscillation occurs at a frequency determined by a delay in the smoothing circuit 42, a delay in the integral attenuator 812, and a transfer function of the feedback. However, since a delay amount of such a feedback path that passes via the terminal Tn1 is large, the feedback that passes via the terminal Tn1 alone cannot increase the frequency of the self-oscillation to an extent where the accuracy of the waveform of the drive signal Com can be ensured sufficiently. In contrast, in this embodiment, separately from the path that passes via the terminal Tn1, a path that feeds back the high-frequency component of the drive signal Com is provided via the terminal Tn2, and accordingly, the delay of the feedback in the whole of the drive signal generation unit 4 can be reduced. That is, in this embodiment, the frequency of the signal As obtained by adding, to the signal Ab, the signal Ay that is the high-frequency component of the drive signal Com can be set higher compared with when the path that passes via the terminal Tn2 is not present, and accordingly, it becomes possible to sufficiently ensure the accuracy of the drive signal Com.

4. Drive Unit and Storage Unit

Hereinafter, referring to FIGS. 8 and 9, a description will be given of the drive unit 6 including the drive signal generation unit 4 and the power supply unit 5, and of a storage unit 600 that stores the drive unit 6.

Figure 8:
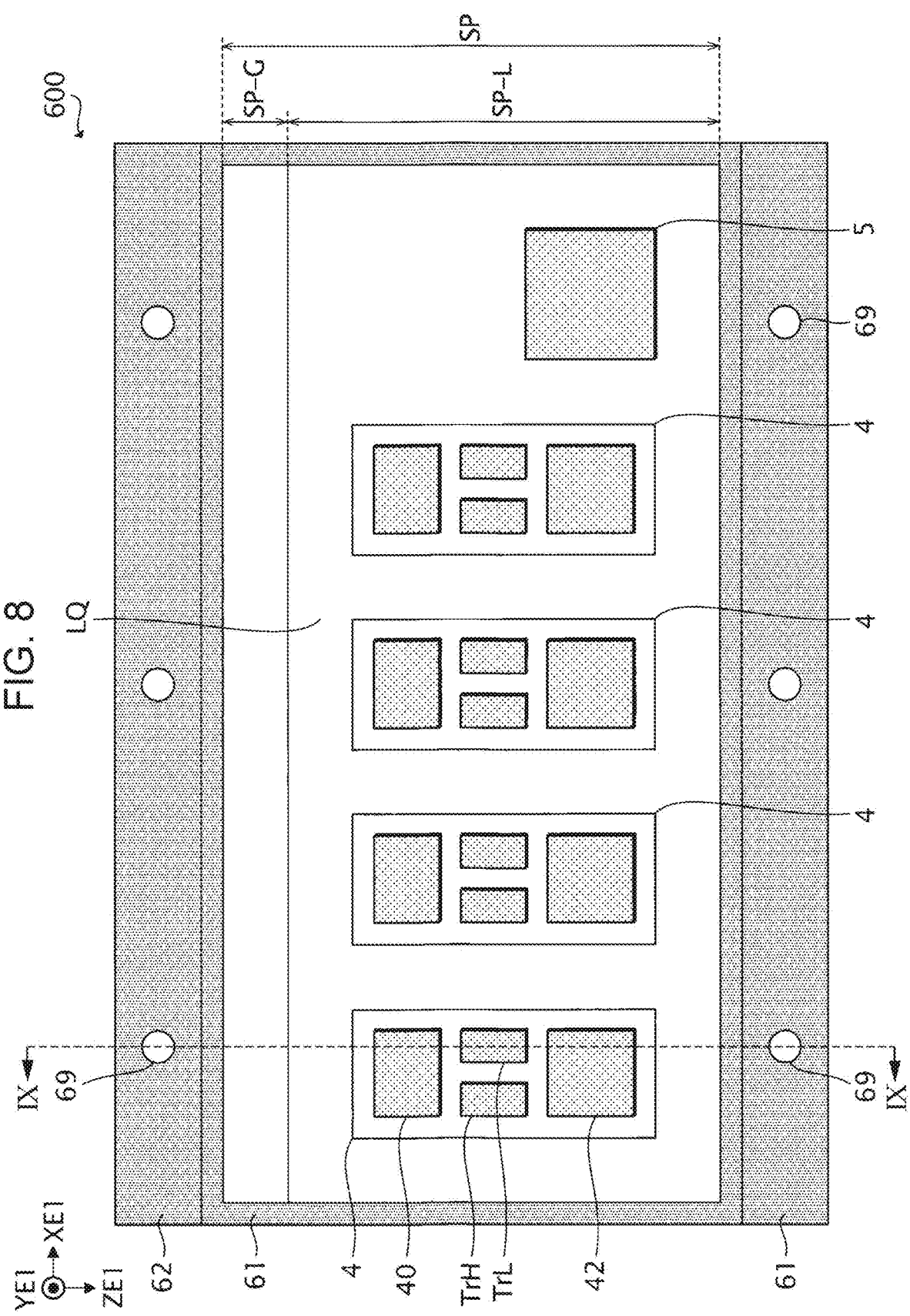
FIG. 8 is a plan view for explaining an example of structures of a drive unit and a storage unit.

FIG. 8 is a plan view of the drive unit 6 and the storage unit 600 when viewed from a YE1-direction side toward a YE2-direction side opposite from the YE1-direction side. FIG. 9 is a sectional view of the drive unit 6 and the storage unit 600, cut along line IX-IX in FIG. 8.

Note that, hereinafter, the YE1-direction and the YE2-direction opposite from the YE1-direction will be collectively referred to as "YE-axis direction", an XE1-direction that intersects the YE-axis direction and an XE2-direction opposite from the XE1-direction will be collectively referred to as "XE-axis direction", and a ZE1-direction that intersects the XE-axis direction and the YE-axis direction and a ZE2-direction opposite from the ZE1-direction will be collectively referred to as "ZE-axis direction". This embodiment will be described by assuming, as an example, that the XE-axis direction, the YE-axis direction, and the ZE-axis direction are perpendicular to one another. However, the present disclosure is not limited to such a mode. The XE-axis direction, the YE-axis direction and the ZE-axis direction need only intersect one another. Moreover, in this embodiment, it is assumed that the ZE1-direction is a direction substantially parallel to the direction of gravity. Moreover, the ZE1-direction may be a direction substantially parallel to the Z1-direction. Herein, "substantially parallel" denotes a concept including a case where directions or the like can be regarded as being parallel when errors are taken into consideration as well as a case where the directions or the like are completely parallel. In this embodiment, it is assumed that "substantially parallel" denotes a concept including a case where the directions or the like can be regarded as being parallel when an error of approximately 10% is considered.

Figure 9:
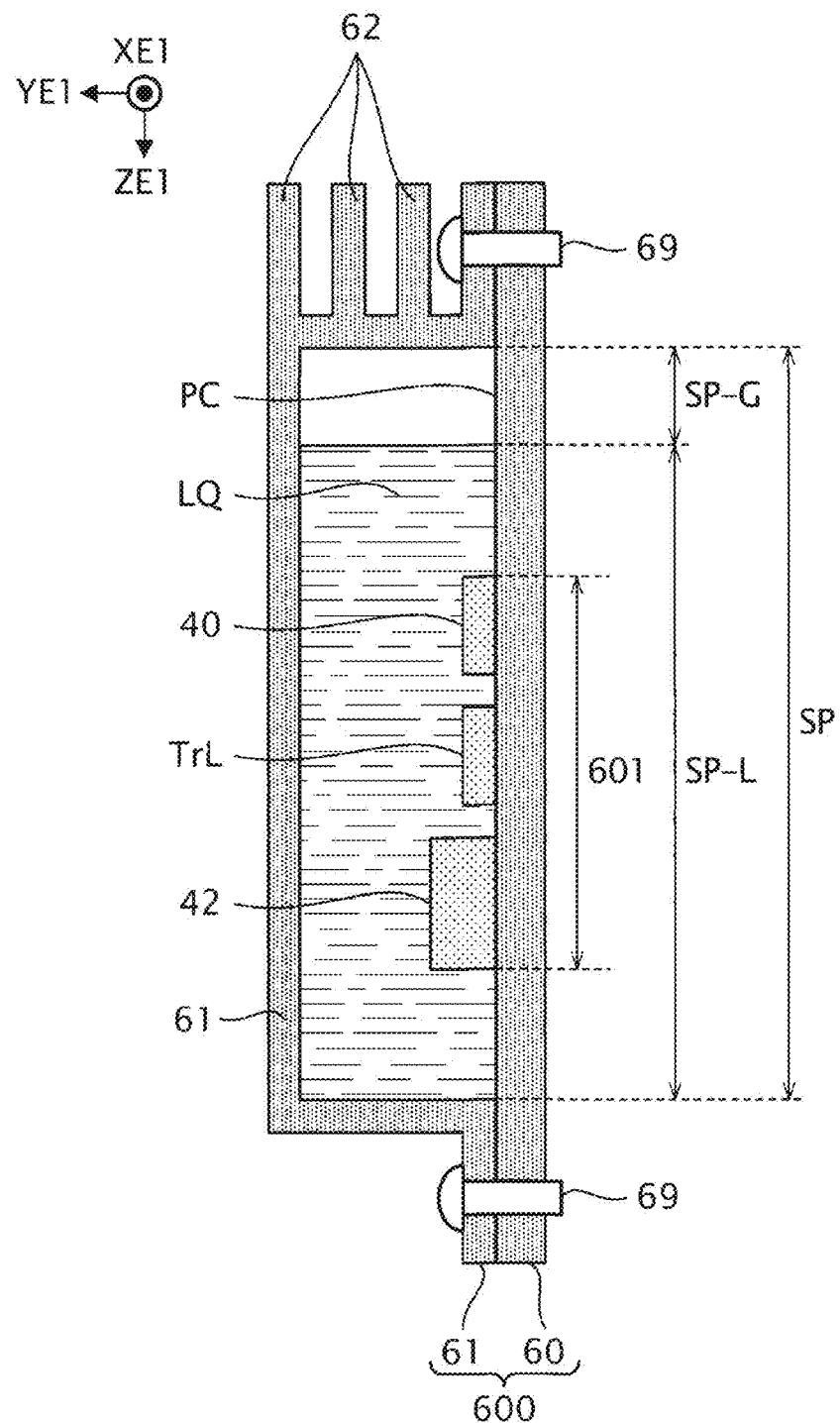
FIG. 9 is a sectional view for explaining the example of the structures of the drive unit and the storage unit.

As illustrated in FIGS. 8 and 9, the storage unit 600 includes a circuit board 60 and a cover 61.

The drive unit 6 is provided on a circuit forming surface PC of the circuit board 60. Herein, the circuit forming surface PC is a surface of the circuit board 60 and is a surface that faces the YE1-direction between two surfaces thereof which have the YE-axis direction as a direction normal to the two surfaces.

The cover 61 is formed of metal. Specifically, the cover 61 is formed of a metal such as iron or copper, which has thermal conductivity equal to or higher than a first thermal conductivity. Herein, the first thermal conductivity is, for example, 10 [W/m·K], and more preferably 50 [W/m·K]. Moreover, the cover 61 is fixed to the circuit board 60 by screws 69 and an adhesive so as to be in contact with the circuit forming surface PC of the circuit board 60. Note that the cover 61 has a shape in which a vicinity of a center in the ZE-axis direction protrudes in the YE1-direction. Therefore, the cover 61 is fixed to the circuit board 60, such that a space SP is formed between the cover 61 and the circuit board 60.

Moreover, the cover 61 includes a heat sink 62. Specifically, the heat sink 62 is attached to a portion of the cover 61, which is located further in the ZE2-direction than the space SP.

A cooling liquid LQ is stored in the space SP. In this embodiment, the cooling liquid LQ is stored in the space SP so that a liquid level of the cooling liquid LQ is located further in the Z2-direction than an end portion in the ZE2-direction of the drive unit 6 stored in the space SP. That is, in this embodiment, the cooling liquid LQ is retained in the space SP so that the liquid level of the cooling liquid LQ is located further in the Z2-direction than an end portion in the Z2-direction of a circuit arrangement portion 601 of the circuit board 60, which is a portion provided with the drive unit 6. Hereinafter, in the space SP, a space in which the cooling liquid LQ is stored will be referred to as "partial space SP-L". Moreover, in the space SP, a space located further in the ZE2-direction than the liquid level of the cooling liquid LQ, that is, a space defined by excluding the partial space SP-L from the space SP, will be referred to as "partial space SP-G". Note that, in this embodiment, it is assumed that the cooling liquid LQ is hermetically sealed in the space SP so that the cooling liquid LQ does not leak from the space SP even if an attitude of the ink jet printer 1 changes.

Herein, the cooling liquid LQ is a liquid for cooling the drive unit 6. More specifically, the cooling liquid LQ is, for example, an insulating liquid having thermal conductivity equal to or higher than a second thermal conductivity. Herein, the second thermal conductivity is, for example, 0.09 [W/m·K], and more preferably 0.13 [W/m·K].

Moreover, the cooling liquid LQ has a property of boiling or evaporating to become a gas GQ at a reference temperature Tb based on an operating temperature Td of the drive unit 6. Note that, in this embodiment, it is assumed that, like the cooling liquid LQ, the gas GQ is also hermetically sealed in the space SP.

Herein, the operating temperature Td may be an operating temperature Td1 of the drive signal generation unit 4 when the drive signal generation unit 4 generates the drive signal Com, may be an operating temperature Td2 of the power supply unit 5 when the power supply unit 5 supplies electric power to one or both of the head unit 3 and the drive signal generation unit 4, or may be a temperature determined in accordance with these two operating temperature Td1 and operating temperature Td2. The temperature determined in accordance with the operating temperature Td1 and the operating temperature Td2 may be a lower temperature of the operating temperature Td1 and the operating temperature Td2, may be a higher temperature of the operating temperature Td1 and the operating temperature Td2, or may be an average temperature of the operating temperature Td1 and the operating temperature Td2.

Moreover, for example, the reference temperature Tb may be the same temperature as the operating temperature Td or may be a temperature between an ambient temperature of the ink jet printer 1 and the operating temperature Td of the ink jet printer 1.

Further, the cooling liquid LQ is a liquid having a viscosity equal to or higher than a predetermined viscosity. Herein, for example, the predetermined viscosity may be a viscosity higher than the viscosity of water.

In this embodiment, when the drive unit 6 performs driving, the cooling liquid LQ boils or evaporates to become the gas GQ in response to heat from the drive unit 6. Then, the gas GQ is cooled and condensed by the heat sink 62 and returns to the cooling liquid LQ. That is, according to this embodiment, a cycle including a process in which the cooling liquid LQ becomes the gas GQ in response to the heat from the drive unit 6 and a process in which the gas GQ becomes the cooling liquid LQ by being cooled by the heat sink 62 is repeated to cool the drive unit 6. Hence, according to this embodiment, it is not necessary to provide a structure for circulating the cooling liquid LQ, and accordingly, compared with a mode that requires the structure of circulating the cooling liquid LQ, it becomes possible to reduce the size of the drive unit 6, and ultimately, to reduce the size of the ink jet printer 1.

Moreover, according to this embodiment, all of the drive unit 6 and the circuit arrangement portion 601 of the circuit board 60 are covered with the cooling liquid LQ. Therefore, according to this embodiment, dust adhering to the drive unit 6 can be suppressed, and in addition, it becomes possible to suppress adherence of a mist, which floats inside the housing 100, to the drive unit 6. Thus, according to this embodiment, compared with a mode in which the drive unit 6 is not covered with the cooling liquid LQ, it becomes possible to reduce a possibility of an occurrence of a malfunction such as a short circuit or a current leakage in the drive unit 6, which may result from the adherence of the mist.

Note that, in this embodiment, the cooling liquid LQ is an example of a cooling liquid, the space SP is an example of a liquid storage space, and the cover 61 is an example of a storage mechanism.

5. Conclusion of Embodiment

As described above, the ink jet printer 1 according to this embodiment includes: the head unit 3 that ejects ink to form an image on recording paper PP; the circuit board 60 provided with the drive unit 6 for driving the head unit 3; and the cover 61 for storing the cooling liquid LQ in the space SP. The cover 61 stores the cooling liquid LQ in the space SP in which all of the drive unit 6 and the circuit arrangement portion 601 of the circuit board 60 are immersed in the cooling liquid LQ. The circuit arrangement portion 601 is provided with the drive unit 6.

Therefore, according to this embodiment, it becomes possible to suppress adherence of a mist of the ink, which floats inside the ink jet printer 1, to the drive unit 6.

Moreover, in this embodiment, the drive unit 6 may include the power supply unit 5 that supplies electric power to the head unit 3.

Therefore, according to this embodiment, it becomes possible to suppress adherence of the mist of the ink, which floats inside the ink jet printer 1, to the power supply unit 5.

Further, in this embodiment, the drive unit 6 may include the drive signal generation unit 4 that generates the drive signal Com for driving the head unit 3.

Therefore, according to this embodiment, it becomes possible to suppress adherence of the mist of the ink, which floats inside the ink jet printer 1, to the drive signal generation unit 4.

Moreover, in this embodiment, the cover 61 may have a metal wall portion for storing the cooling liquid LQ.

Therefore, according to this embodiment, the drive unit 6 can be cooled effectively.

Further, in this embodiment, the cover 61 may have a heat sink 62 that dissipates heat in the space SP to outside the space SP.

Therefore, according to this embodiment, the drive unit 6 can be cooled effectively.

Moreover, in this embodiment, the cooling liquid LQ may be a liquid that has a viscosity equal to or higher than a predetermined viscosity.

Therefore, according to this embodiment, compared with when the cooling liquid LQ has a viscosity lower than the predetermined viscosity, a possibility that the cooling liquid LQ may leak from the space SP can be reduced.

B. Modified Examples

The embodiment described above can be variously modified. Specific modified modes will be illustrated below. Any two or more modes selected from the following illustrations can be appropriately combined within the scope without mutual contradiction. Note that, for elements in the modified examples to be illustrated below, which are equivalent in effect and function to those of the embodiment, reference numerals and symbols referred to in the above description will be used to appropriately omit detailed description thereof.

Modified Example 1

The above-mentioned embodiment is described by illustrating such a mode in which the space SP formed by the cover 61 and the circuit board 60 is a closed space and in which the cooling liquid LQ is hermetically sealed in the space SP; however, the present disclosure is not limited to such a mode. For example, the cover 61 may form the space SP, in which the cooling liquid LQ is stored, such that the cooling liquid LQ is not hermetically sealed between the cover 61 and the circuit board 60. That is, the space SP may be a space coupled to a space outside the storage unit 600.

Modified Example 2

The embodiment and the modified example 1, which are mentioned above, are described by illustrating a mode when the storage unit 600 includes the circuit board 60; however, the present disclosure is not limited to such a mode. For example, the circuit board 60 may be provided separately from the storage unit 600 and may be housed inside the storage unit 600. In this mode, the space SP may be a space inside the storage unit 600 and may be a space that houses the drive signal generation unit 4, the power supply unit 5, and the circuit board 60.

Modified Example 3

The embodiment and the modified examples 1 and 2, which are mentioned above, are described by illustrating a mode when the drive unit 6 stored in the space SP includes the drive signal generation unit 4 and the power supply unit 5; however, the present disclosure is not limited to such a mode. For example, the power supply unit 5 may be provided separately from the drive unit 6. In this mode, in the space SP that is formed by the storage unit 600 and in which the cooling liquid LQ is stored, the drive signal generation unit 4 is stored, and the power supply unit 5 does not need to be stored. Moreover, for example, the drive signal generation unit 4 may be provided separately from the drive unit 6. In this mode, in the space SP that is formed by the storage unit 600 and in which the cooling liquid LQ is stored, the power supply unit 5 may be stored, and the drive signal generation unit 4 does not need to be stored.

Note that, when the drive signal generation unit 4 is stored in the space SP, then in the drive signal generation unit 4, only the amplifier circuit 41 and the smoothing circuit 42, whose heat generation amount is relatively high, may be immersed in the cooling liquid LQ, and portions in the drive signal generation unit 4, which exclude the amplifier circuit 41 and the smoothing circuit 42, do not need to be immersed in the cooling liquid LQ. Moreover, when the drive signal generation unit 4 is stored in the space SP, then in the drive signal generation unit 4, only the amplifier circuit 41 whose heat generation amount is relatively high may be immersed in the cooling liquid LQ, and portions in the drive signal generation unit 4, which exclude the amplifier circuit 41, do not need to be immersed in the cooling liquid LQ. Further, when the drive signal generation unit 4 is stored in the space SP, then in the drive signal generation unit 4, only the smoothing circuit 42 whose heat generation amount is relatively high may be immersed in the cooling liquid LQ, and portions in the drive signal generation unit 4, which exclude the smoothing circuit 42, do not need to be immersed in the cooling liquid LQ.

Modified Example 4

The embodiment and the modified examples 1 to 3, which are mentioned above, are described by illustrating a mode when the drive unit 6 stored in the space SP does not include the control unit 2; however, the present disclosure is not limited to such a mode. For example, the drive unit 6 may include the control unit 2. In this mode, in the space SP that is formed by the storage unit 600 and in which the cooling liquid LQ is stored, the control unit 2 may be stored together with one or both of the drive signal generation unit 4 and the power supply unit 5.

Modified Example 5

In the embodiment and the modified examples 1 to 4, which are mentioned above, a mode when the ink jet printer 1 includes four head units 3 is assumed; however, the present disclosure is not limited to such a mode. The ink jet printer 1 may include one to three head units 3, or the ink jet printer 1 may include five or more head units 3.

Modified Example 6

In the embodiment and the modified examples 1 to 5, which are mentioned above, a mode in which the ink jet printer 1 is a serial printer is illustrated; however, the present disclosure is not limited to such a mode. The ink jet printer 1 may be a line printer in which, in the head unit 3, a plurality of nozzles N are provided so as to extend more widely than a width of the recording paper PP.

What is claimed is:

1. A printing apparatus comprising:
    a liquid ejecting head that ejects a printing liquid to form an image on a medium;
    a circuit board provided with a drive circuit for driving the liquid ejecting head; and
    a storage mechanism for storing a cooling liquid in a liquid storage space, wherein
    the storage mechanism stores the cooling liquid in the liquid storage space in which all of the drive circuit and a circuit arrangement portion of the circuit board are immersed in the cooling liquid, the circuit arrangement portion being provided with the drive circuit.
2. The printing apparatus according to claim 1, wherein the drive circuit includes a power supply circuit that supplies electric power to the liquid ejecting head.
3. The printing apparatus according to claim 1, wherein the drive circuit includes a drive signal generation circuit that generates a drive signal for driving the liquid ejecting head.
4. The printing apparatus according to claim 1, wherein the storage mechanism has a metal wall portion for storing the cooling liquid.
5. The printing apparatus according to claim 1, wherein the storage mechanism has a heat sink that dissipates heat in the liquid storage space to outside the liquid storage space.
6. The printing apparatus according to claim 1, wherein the cooling liquid is a liquid that has a viscosity equal to or higher than a predetermined viscosity.

\* \* \* \* \*